(12) United States Patent
Lee (10) Patent No.: US 9,118,308 B1
(45) Date of Patent: Aug. 25, 2015

(54) DUTY CYCLE CORRECTOR

(71) Applicant: VIA TECHNOLOGIES, INC., New Taipei (TW)

(72) Inventor: Yeong-Sheng Lee, Fremont, CA (US)

(73) Assignee: VIA TECHNOLOGIES, INC., New Taipei (TW)

( * ) Notice: Subject to any disclaimer, the term of this patent is extended or adjusted under 35 U.S.C. 154(b) by 32 days.

(21) Appl. No.: 14/175,220

(22) Filed: Feb. 7, 2014

(51) Int. Cl.
*H03K 5/156* (2006.01)
*H03K 3/017* (2006.01)

(52) U.S. Cl.
CPC ............ *H03K 3/017* (2013.01); *H03K 5/1565* (2013.01)

(58) Field of Classification Search
CPC ......... H03K 5/01; H03K 5/04; H03K 5/1565; H03K 5/1534; H03K 7/08
USPC .......................................... 327/172, 174, 175
See application file for complete search history.

(56) References Cited

U.S. PATENT DOCUMENTS

| | | | | |
|---|---|---|---|---|
| 5,050,194 | A * | 9/1991 | Pickering et al. | ............... 375/357 |
| 6,173,432 | B1 * | 1/2001 | Harrison | ....................... 716/113 |
| 7,292,670 | B2 | 11/2007 | Gupta et al. | |
| 7,705,649 | B1 | 4/2010 | Yu et al. | |
| 7,710,173 | B2 | 5/2010 | Shim | |
| 2006/0244514 | A1 * | 11/2006 | Lee et al. | ....................... 327/536 |
| 2008/0144861 | A1 * | 6/2008 | Melanson et al. | ............ 381/120 |

OTHER PUBLICATIONS

Figures on "http://hyperphysics.phy-astr.gsu.edu/hbase/electronic/tflipflop.html;" Feb. 2014; pp. 1-4.

* cited by examiner

*Primary Examiner* — John Poos
(74) *Attorney, Agent, or Firm* — McClure, Qualey & Rodack, LLP (57) ABSTRACT

A duty cycle corrector includes a VCD (Voltage-Controlled Delay) circuit, an edge detector, an SR latch, a mode controller, and a CP (Charge Pump) circuit. The VCD circuit delays an input clock signal for a delay period so as to generate a delay clock signal. The delay period is adjusted according to a CP control voltage. The edge detector detects clock edges of the input clock signal and the delay clock signal so as to correspondingly generate a first clock edge signal and a second clock edge signal. The SR latch generates a toggling signal according to the first clock edge signal and the second clock edge signal. The mode controller generates a mode control voltage. The CP circuit operates in different modes according to the mode control voltage. The CP circuit generates the CP control voltage according to the toggling signal and the mode control voltage.

10 Claims, 6 Drawing Sheets

DUTY CYCLE CORRECTOR

BACKGROUND OF THE INVENTION

1. Field of the Invention

The disclosure generally relates to a duty cycle corrector, and more particularly, relates to a duty cycle corrector with a wide adjustable range of duty cycle.

2. Description of the Related Art

In many applications, a clock signal with a 50% duty cycle is important, such as DDR (Double Data Rate) applications and other critical communication applications. A conventional design, for example, uses two differential input clock signals and a differential amplifier to recover a correct output clock signal with a 50% duty cycle. However, in some cases, there is only one input clock signal or a single input terminal, and it is a challenge for a designer to recover a correct output clock signal without using the above differential method. In addition, the conventional differential design may just adjust the duty cycle of a clock signal from about 40% to 60%, which is very limited and may not be applied to some extreme cases.

BRIEF SUMMARY OF THE INVENTION

To solve the problem of the prior art, in a preferred embodiment, the invention is directed to a duty cycle corrector, including: a VCD (Voltage-Controlled Delay) circuit, receiving an input clock signal, and delaying the input clock signal for a delay period so as to generate a delay clock signal, wherein the delay period is adjusted according to a CP (Charge Pump) control voltage; an edge detector, detecting clock edges of the input clock signal and the delay clock signal so as to correspondingly generate a first clock edge signal and a second clock edge signal; an SR latch, generating a toggling signal according to the first clock edge signal and the second clock edge signal; a mode controller, generating a mode control voltage; and a CP (Charge Pump) circuit, operating in either a first mode or a second mode according to the mode control voltage, and generating the CP control voltage according to the toggling signal and the mode control voltage; wherein the toggling signal is generated as an output signal of the duty cycle corrector.

In some embodiments, the edge detector includes: a first inverter, wherein the first inverter has an input terminal for receiving the input clock signal, and an output terminal; a first AND gate, wherein the first AND gate has a first input terminal for receiving the input clock signal, a second input terminal coupled to the output terminal of the first inverter, and an output terminal for outputting the first clock edge signal; a second inverter, wherein the second inverter has an input terminal for receiving the delay clock signal, and an output terminal; and a second AND gate, wherein the second AND gate has a first input terminal for receiving the delay clock signal, a second input terminal coupled to the output terminal of the second inverter, and an output terminal for outputting the second clock edge signal.

In some embodiments, the SR latch includes: a first NOR gate, wherein the first NOR gate has a first input terminal for receiving the first clock edge signal, a second input terminal for receiving the toggling signal, and an output terminal; and a second NOR gate, wherein the second NOR gate has a first input terminal for receiving the second clock edge signal, a second input terminal coupled to the output terminal of the first NOR gate, and an output terminal for outputting the toggling signal.

In some embodiments, the mode controller includes: a programmable counter, receiving a start signal, the input clock signal, and a plurality of duration bits, and accordingly generating a notification signal, wherein when the start signal rises from a low logic level to a high logic level, the programmable counter starts to count a calibration period, wherein when the calibration period expires, the notification signal rises from the low logic level to the high logic level, and wherein the calibration period is determined by the duration bits; and a third AND gate, wherein the third AND gate has a first input terminal for receiving the notification signal, a second input terminal for receiving a mode selection signal, and an output terminal for outputting the mode control voltage.

In some embodiments, when the mode selection signal is equal to the low logic level or when the mode selection signal is equal to the high logic level and the calibration period has not expired, the mode control voltage is set to the low logic level, and the CP circuit operates in the first mode such that the CP control voltage is adjustable, and wherein when the mode selection signal is equal to the high logic level and the calibration period has expired, the mode control voltage is set to the high logic level, and the CP circuit operates in the second mode such that the CP control voltage is not adjustable.

In some embodiments, after the CP control voltage becomes constant, the delay period of the VCD circuit is substantially equal to 0.5 clock period of the input clock signal such that the output clock signal substantially has a 50% duty cycle.

In some embodiments, the number of the duration bits is 4.

In some embodiments, the programmable counter includes: a fourth AND gate, wherein the fourth AND gate has a first input terminal for receiving the input clock signal, a second input terminal, and an output terminal; a plurality of D flip-flops, wherein each D flip-flop has a clock terminal, a data input terminal, an output terminal, an inverted output terminal, and an inverted reset terminal for receiving the start signal, wherein the inverted output terminal of each D flip-flop is fed back to the data input terminal, wherein the clock terminal of each D flip-flop is coupled to the output terminal of a previous D flip-flop, and wherein the clock terminal of a first D flip-flop is coupled to the output terminal of the fourth AND gate.

In some embodiments, the programmable counter further includes: a plurality of XNOR gates, each corresponding to one of the plurality of D flip-flops, wherein each XNOR gate has a first input terminal for receiving one of a plurality of duration bits, a second input terminal coupled to the output terminal of the corresponding D flip-flop, and an output terminal, and wherein a calibration period is determined by the plurality of duration bits; a fifth AND gate, wherein the fifth AND gate has a plurality of input terminals each corresponding to one of the plurality of XNOR gates and an output terminal, wherein each input terminal is coupled to the output terminal of the corresponding XNOR gate; and a fifth D flip-flop, wherein the fifth D flip-flop has a clock terminal for receiving the input clock signal, a data input terminal coupled to the output terminal of the fifth AND gate, an output terminal for outputting the notification signal, an inverted output terminal fed back to the second input terminal of the fourth AND gate, and an inverted reset terminal for receiving the start signal.

In some embodiments, the CP circuit includes: a fourth PMOS transistor (P-type Metal Oxide Semiconductor Field Effect Transistors), wherein the fourth PMOS transistor has a gate coupled to the inverse of the toggling signal, a source coupled to a work voltage, and a drain; a fifth PMOS transistor, wherein the fifth PMOS transistor has a gate for receiving the mode control voltage, a source coupled to the drain of the fourth PMOS transistor, and a drain coupled to a CP output node; a first NMOS transistor (N-type Metal Oxide Semiconductor Field Effect Transistors), wherein the first NMOS transistor has a gate coupled to the inverse of the mode control voltage, a source, and a drain coupled to the CP output node; a second NMOS transistor, wherein the second NMOS transistor has a gate coupled to the inverse of the toggling signal, a source coupled to a ground voltage, and a drain coupled to the source of the first NMOS transistor; and an output capacitor, coupled between the CP output node and the ground voltage; wherein the CP output node is arranged to output the CP control voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
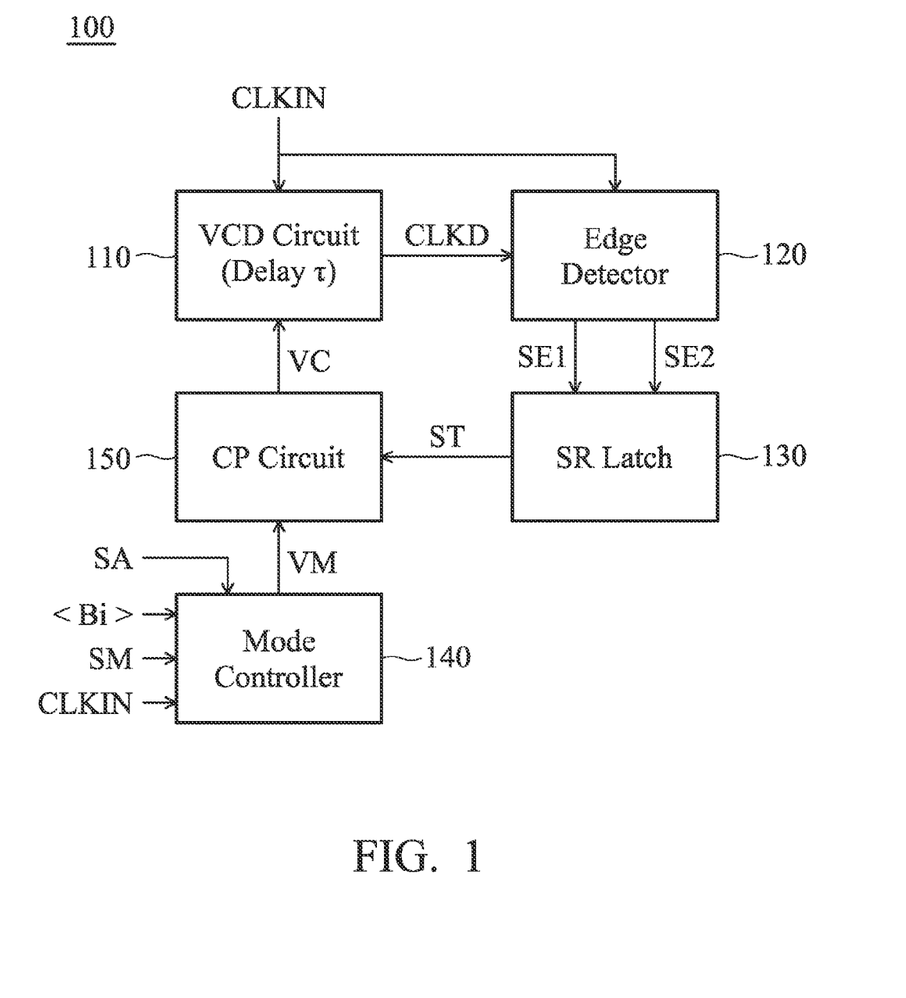
FIG. 1 is a diagram for illustrating a duty cycle corrector according to an embodiment of the invention.

FIG. 1 is a diagram for illustrating a duty cycle corrector 100 according to an embodiment of the invention. As shown in FIG. 1, the duty cycle corrector 100 includes a VCD (Voltage-Controlled Delay) circuit 110, an edge detector 120, an SR latch 130, a mode controller 140, and a CP (Charge Pump) circuit 150. The VCD circuit 110 receives an input clock signal CLKIN. The input clock signal CLKIN may have any duty cycle, for example, from 20% to 80%. The VCD circuit 110 is configured to delay the input clock signal CLKIN for a delay period t so as to generate a delay clock signal CLKD. That is, the delay clock signal CLKD and the input clock signal CLKIN may have identical waveforms but have different phases. The delay period E of the VCD circuit 110 may be adjusted according to a CP (Charge Pump) control voltage VC from the CP circuit 150. The VCD circuit 110 may be implemented by varieties of common voltage-controlled delay line circuits known by those skilled in the art. The edge detector 120 is configured to detect clock edges (e.g., rising edges and/or falling edges) of the input clock signal CLKIN and the delay clock signal CLKD so as to generate a first clock edge signal SE1 and a second clock edge signal SE2, respectively. The SR latch 130 is configured to generate a toggling signal ST according to the first clock edge signal SE1 and the second clock edge signal SE2. The mode controller 140 is configured to generate a mode control voltage VM. In some embodiments, the mode controller 140 generates the mode control voltage VM according to a start signal SA, one or more duration bits <Bi>, a mode selection signal SM, and the input clock signal CLKIN. The CP circuit 150 operates in either a first mode or a second mode according to the mode control voltage VM. The CP circuit 150 is further configured to generate the CP control voltage VC according to the toggling signal ST and the mode control voltage VM. For example, if the CP circuit 150 operates in the first mode, the CP control voltage VC may be adjustable, and if the CP circuit 150 operates in the second mode, the CP control voltage VC may be kept constant. After the CP control voltage VC becomes constant, the delay period τ of the VCD circuit 110 is fine-tuned, and an output clock signal of the duty cycle corrector 100 is further generated according to the input clock signal CLKIN and the delay clock signal CLKD. The output clock signal may be correct and substantially have a 50% duty cycle. The detailed circuits and operations of the duty cycle corrector 100 will be described in the following embodiments.

Figure 2:
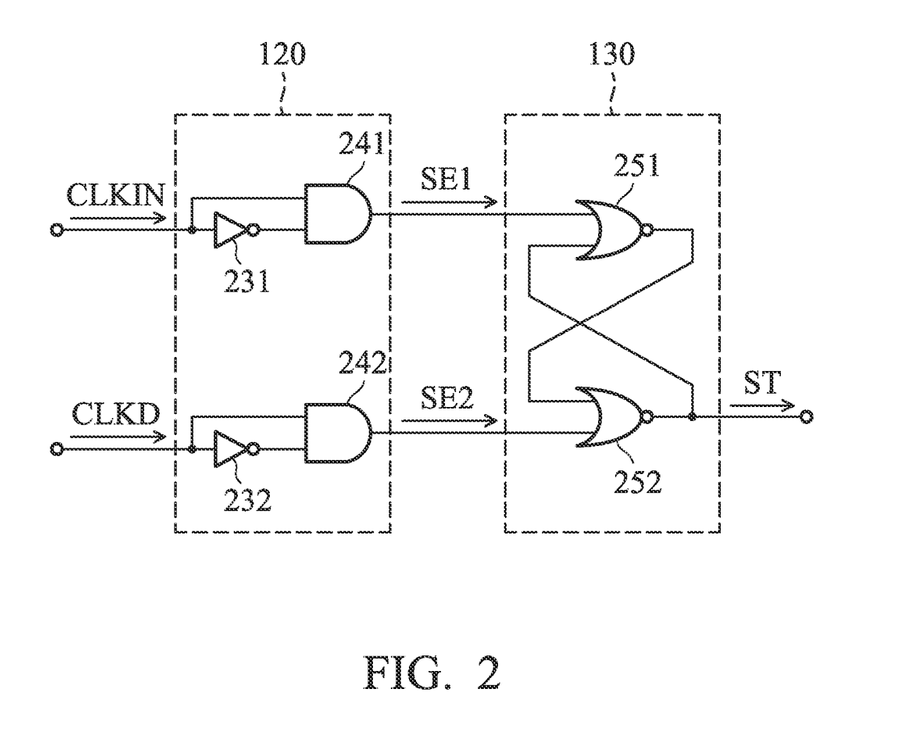
FIG. 2 is a diagram for illustrating an edge detector and an SR latch according to an embodiment of the invention.

FIG. 2 is a diagram for illustrating the edge detector 120 and the SR latch 130 according to an embodiment of the invention. In the embodiment of FIG. 2, the edge detector 120 includes a first inverter 231, a second inverter 232, a first AND gate 241, and a second AND gate 242. The first inverter 231 has an input terminal for receiving the input clock signal CLKIN, and an output terminal. The first AND gate 241 has a first input terminal for receiving the input clock signal CLKIN, a second input terminal coupled to the output terminal of the first inverter 231, and an output terminal for outputting the first clock edge signal SE1. The second inverter 232 has an input terminal for receiving the delay clock signal CLKD, and an output terminal. The second AND gate 242 has a first input terminal for receiving the delay clock signal CLKD, a second input terminal coupled to the output terminal of the second inverter 232, and an output terminal for outputting the second clock edge signal SE2. In the embodiment of FIG. 2, the SR latch 130 includes a first NOR gate 251 and a second NOR gate 252. The first NOR gate 251 has a first input terminal for receiving the first clock edge signal SE1, a second input terminal for receiving the toggling signal ST, and an output terminal. The second NOR gate 252 has a first input terminal for receiving the second clock edge signal SE2, a second input terminal coupled to the output terminal of the first NOR gate 251, and an output terminal for outputting the toggling signal ST.

The edge detector 120 and the SR latch 130 may operate as follows. The first AND gate 241 receives the input clock signal CLKIN and its complementary signal, and therefore the output first clock edge signal SE1 rises to a high logic level for a very short time at clock edges of the input clock signal CLKIN. The second AND gate 242 receives the delay clock signal CLKD and its complementary signal, and therefore the output second clock edge signal SE2 rises to a high logic level for a very short time at clock edges of the delay clock signal CLKD. The first NOR gate 251 and the second NOR gate 252 are configured to store a logic state, and the logic state may be set or reset by the first clock edge signal SE1 and second clock edge signal SE2. For example, when the first clock edge signal SE1 becomes a high logic level, the output toggling signal ST is set to a high logic level, and when the second clock edge signal SE2 becomes a high logic level, the output toggling signal ST is reset to a low logic level.

Figure 3A:
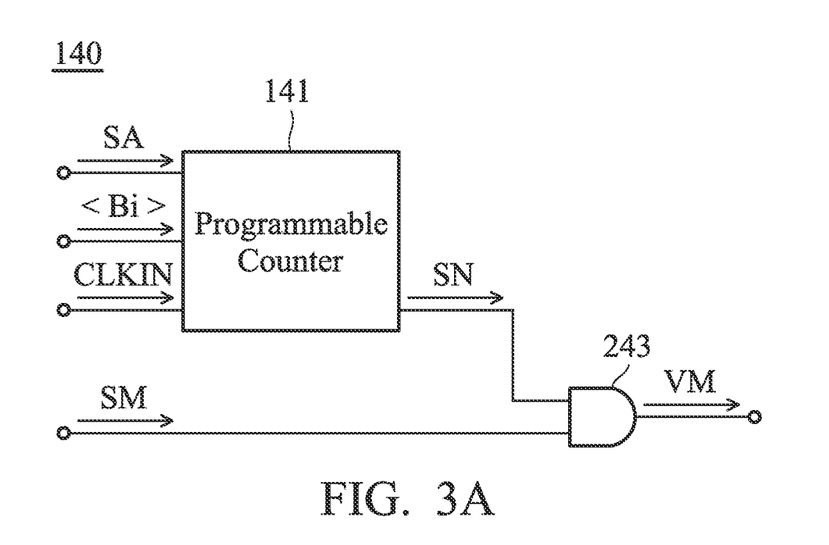
FIG. 3A is a diagram for illustrating a mode controller according to an embodiment of the invention.
Figure 3B:
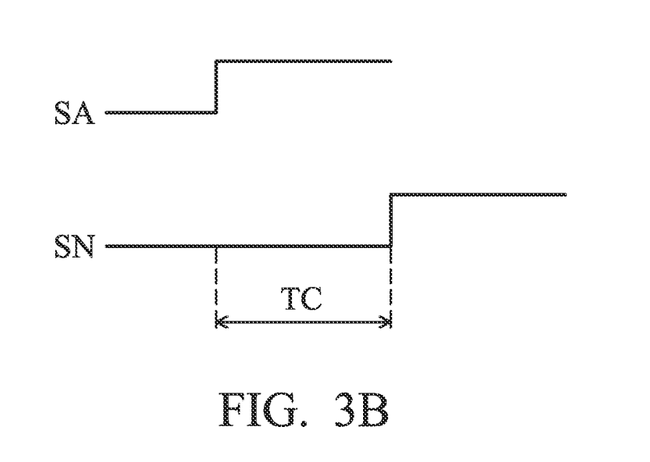
FIG. 3B is a diagram for illustrating signal waveforms of a mode controller according to an embodiment of the invention.

FIG. 3A is a diagram for illustrating the mode controller 140 according to an embodiment of the invention. FIG. 3B is a diagram for illustrating signal waveforms of the mode controller 140 according to an embodiment of the invention. In the embodiment of FIG. 3A and FIG. 3B, the mode controller 140 includes a programmable counter 141 and a third AND gate 243. The programmable counter 141 receives the start signal SA, the input clock signal CLKIN, and the one or more duration bits <Bi>, and generates a notification signal SN according to the above input signals.

The mode controller 140 may operate as follows. When the start signal SA rises from a low logic level to a high logic level, the programmable counter 141 starts to count a calibration period TC. The calibration period TC may be determined by the one or more duration bits <Bi>. For example, if the binary number represented by the duration bits <Bi> becomes greater, the calibration period TC may become longer, and if the binary number represented by the duration bits <Bi> becomes smaller, the calibration period TC may become shorter. Afterwards, when the calibration period TC expires, the output notification signal SN also rises from a low logic level to a high logic level. That is, the notification signal SN is generated by delaying the start signal SA for the calibration period TC. The third AND gate 243 has a first input terminal for receiving the notification signal SN, a second input terminal for receiving the mode selection signal SM, and an output terminal for outputting the mode control voltage VM. The start signal SA, the duration bits <Bi>, and the mode selection signal SM may be generated according to a user input signal. In such a design, when the mode selection signal SM is equal to a low logic level or when the mode selection signal SM is equal to a high logic level and the calibration period TC has not yet expired, the mode control voltage VM is set to a low logic level, and when the mode selection signal SM is equal to a high logic level and the calibration period TC has expired, the mode control voltage VM is set to a high logic level.

Figure 4:
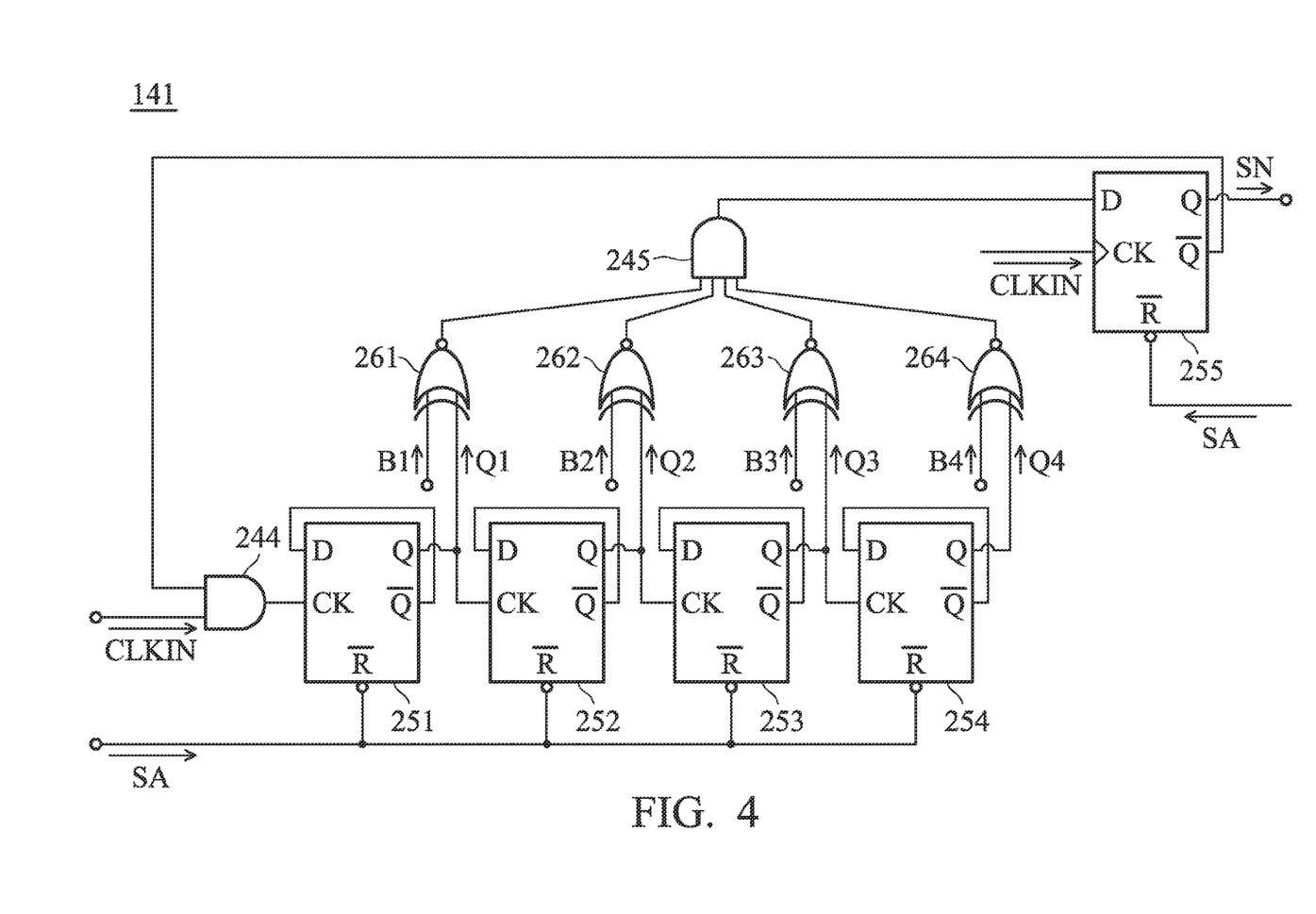
FIG. 4 is a diagram for illustrating a programmable counter according to an embodiment of the invention.

FIG. 4 is a diagram for illustrating the programmable counter 141 according to an embodiment of the invention. In the embodiment of FIG. 4, the programmable counter 141 includes a fourth AND gate 244, a fifth AND gate 245 (with four input terminals in one embodiment), a first D flip-flop 251, a second D flip-flop 252, a third D flip-flop 253, a fourth D flip-flop 254, a fifth D flip-flop 255, a first XNOR gate 261, a second XNOR gate 262, a third XNOR gate 263, and a fourth XNOR gate 264. The duration bits <Bi> includes a first duration bit B1, a second duration bit B2, a third duration bit B3, and a fourth duration bit B4, and these duration bits may be, for example, 0010, 1010, 1110, etc., to represent different lengths of the calibration period TC. The fourth AND gate 244 has a first input terminal for receiving the input clock signal CLKIN, a second input terminal, and an output terminal. The first D flip-flop 251 has a clock terminal (CK) coupled to the output terminal of the fourth AND gate 244, a data input terminal (D), an output terminal (Q), an inverted output terminal (Q-bar), and an inverted reset terminal (R-bar) for receiving the start signal SA. The inverted output terminal of the first D flip-flop 251 is further fed back to the data input terminal of the first D flip-flop 251. The second D flip-flop 252 has a clock terminal (CK) coupled to the output terminal of the first D flip-flop 251, a data input terminal (D), an output terminal (Q), an inverted output terminal (Q-bar), and an inverted reset terminal (R-bar) for receiving the start signal SA. The inverted output terminal of the second D flip-flop 252 is further fed back to the data input terminal of the second D flip-flop 252. The third D flip-flop 253 has a clock terminal (CK) coupled to the output terminal of the second D flip-flop 252, a data input terminal (D), an output terminal (Q), an inverted output terminal (Q-bar), and an inverted reset terminal (R-bar) for receiving the start signal SA. The inverted output terminal of the third D flip-flop 253 is further fed back to the data input terminal of the third D flip-flop 253. The fourth D flip-flop 254 has a clock terminal (CK) coupled to the output terminal of the third D flip-flop 253, a data input terminal (D), an output terminal (Q), an inverted output terminal (Q-bar), and an inverted reset terminal (R-bar) for receiving the start signal SA. The inverted output terminal of the fourth D flip-flop 254 is further fed back to the data input terminal of the fourth D flip-flop 254. The first XNOR gate 261 has a first input terminal for receiving the first duration bit B1, a second input terminal coupled to the output terminal of the first D flip-flop 251, and an output terminal. The second XNOR gate 262 has a first input terminal for receiving the second duration bit B2, a second input terminal coupled to the output terminal of the second D flip-flop 252, and an output terminal. The third XNOR gate 263 has a first input terminal for receiving the third duration bit B3, a second input terminal coupled to the output terminal of the third D flip-flop 253, and an output terminal. The fourth XNOR gate 264 has a first input terminal for receiving the fourth duration bit B4, a second input terminal coupled to the output terminal of the fourth D flip-flop 254, and an output terminal. The fifth AND gate 245 has a first input terminal coupled to the output terminal of the first XNOR gate 261, a second input terminal coupled to the output terminal of the second XNOR gate 262, a third input terminal coupled to the output terminal of the third XNOR gate 263, a fourth input terminal coupled to the output terminal of the fourth XNOR gate 264, and an output terminal. The fifth D flip-flop 255 has a clock terminal (CK) for receiving the input clock signal CLKIN, a data input terminal (D) coupled to the output terminal of the fifth AND gate 245, an output terminal (Q) for outputting the notification signal SN, an inverted output terminal (Q-bar) fed back to the second input terminal of the fourth AND gate 244, and an inverted reset terminal (R-bar) for receiving the start signal SA.

The programmable counter 141 may operate as follows. When the start signal SA rises from a low voltage level to a high logic level, the D flip-flops 251, 252, 253, and 254 are no longer reset, and the programmable counter 141 starts to count the calibration period TC by incrementing by 1 when receiving each CLKIN pulse. When the voltages Q1, Q2, Q3, and Q4 at the output terminals of the D flip-flops 251, 252, 253, and 254 exactly match the duration bits B1, B2, B3, and B4, it is determined that the calibration duration TC expires, and the output notification signal SN rises from a low logic level to a high logic level (as shown in FIG. 3B). It is understood that the four duration bits B1, B2, B3, and B4 corresponding to the four D flip-flops 251, 252, 253, and 254 and the four XNOR gates 261, 262, 263, and 264 described in FIG. 4 are just exemplary. In other embodiments, the programmable counter 141 may be designed to have any number (e.g., 2, 3, 5, or more) of duration bits, D flip-flops, and XNOR gates in similar ways to the above.

Figure 5:
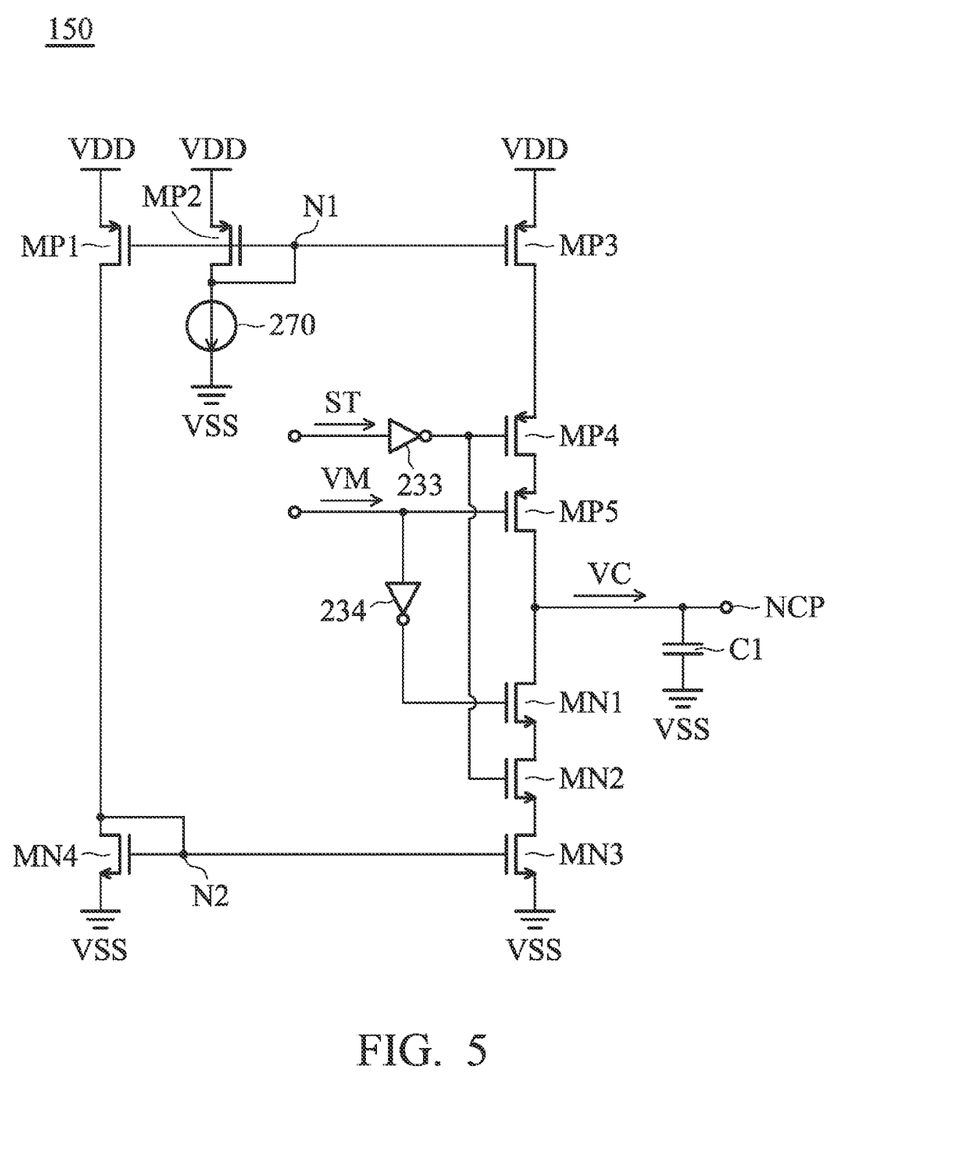
FIG. 5 is a diagram for illustrating a CP circuit according to an embodiment of the invention.

FIG. 5 is a diagram for illustrating the CP circuit 150 according to an embodiment of the invention. In the embodiment of FIG. 5, the CP circuit 150 includes a third inverter 233, a fourth inverter 234, a current sink 270, a fourth PMOS transistor (P-type Metal Oxide Semiconductor Field Effect Transistors) MP4, a fifth PMOS transistor MP5, an output capacitor C1, a first NMOS transistor (N-type Metal Oxide Semiconductor Field Effect Transistors) MN1, a second NMOS transistor MN2, and a current mirror including a first PMOS transistor MP1, a second PMOS transistor MP2, a third PMOS transistor MP3, a third NMOS transistor MN3, and a fourth NMOS transistor MN4. The third inverter 233 has an input terminal for receiving the toggling signal ST, and an output terminal. The fourth inverter 234 has an input terminal for receiving the mode control voltage VM, and an output terminal. The first PMOS transistor MP1 has a gate coupled to a first common node N1, a source coupled to a work voltage VDD (e.g., 1.5V or 3V), and a drain coupled to a second common node N2. The second PMOS transistor MP2 has a gate coupled to the first common node N1, a source coupled to the work voltage VDD, and a drain coupled to the first common node N1. The current sink draws a CP current from the drain of the second PMOS transistor MP2. The third PMOS transistor MP3 has a gate coupled to the first common node N1, a source coupled to the work voltage VDD, and a drain. The fourth PMOS transistor MP4 has a gate coupled to the output terminal of the third inverter 233, a source coupled to the drain of the third PMOS transistor MP3, and a drain. The fifth PMOS transistor MP5 has a gate for receiving the mode control voltage VM, a source coupled to the drain of the fourth PMOS transistor MP4, and a drain coupled to a CP output node NCP. The CP output node NCP is arranged to output the CP control voltage VC. The output capacitor C1 is coupled between the CP output node NCP and a ground voltage VSS (e.g., 0V). The first NMOS transistor MN1 has a gate coupled to the output terminal of the fourth inverter 234, a source, and a drain coupled to the CP output node NCP. The second NMOS transistor MN2 has a gate coupled to the output terminal of the third inverter 233, a source, and a drain coupled to the source of the first NMOS transistor MN1. The third NMOS transistor MN3 has a gate coupled to the second common node N2, a source coupled to the ground voltage VSS, and a drain coupled to the source of the second NMOS transistor MN2. The fourth NMOS transistor MN4 has a gate coupled to the second common node N2, a source coupled to the ground voltage VSS, and a drain coupled to the second common node N2.

The CP circuit 150 may operate as follows. A current mirror is formed by the first PMOS transistor MP1, the second PMOS transistor MP2, the third PMOS transistor MP3, the third NMOS transistor MN3, and the fourth NMOS transistor MN4, and these PMOS and NMOS transistors may substantially conduct the same CP currents. A CP current flowing through the third PMOS transistor MP3 is arranged to charge the output capacitor C1. Another CP current flowing through the third NMOS transistor MN3 is arranged to discharge the output capacitor C1. Furthermore, the mode control voltage VM is arranged to control the operation mode of the CP circuit 150, and the toggling signal ST is arranged to determine the discharging and charging periods of the CP circuit 150. When the mode control voltage VM is equal to a low logic level, the CP circuit 150 operates in the first mode, and the fifth PMOS transistor MP5 and the first NMOS transistor MN1 are both enabled such that the CP control voltage VC is adjustable. In the first mode, when the toggling signal ST is equal to a low logic level (the discharging periods), the fourth PMOS transistor MP4 is disabled but the second NMOS transistor MN2 is enabled such that the output capacitor C1 is discharged and the CP control voltage VC is pulled down. In the first mode, when the toggling signal ST is equal to a high logic level (the charging period), the fourth PMOS transistor MP4 is enabled but the second NMOS transistor MN2 is disabled such that the output capacitor C1 is charged and the CP control voltage VC is pulled up. On the other hand, when the mode control voltage VM is equal to a high logic level, the CP circuit 150 operates in the second mode, and the fifth PMOS transistor MP5 and the first NMOS transistor MN1 are both disabled such that the CP control voltage VC is not affected by the CP current anymore and is kept constant.

Figure 6:
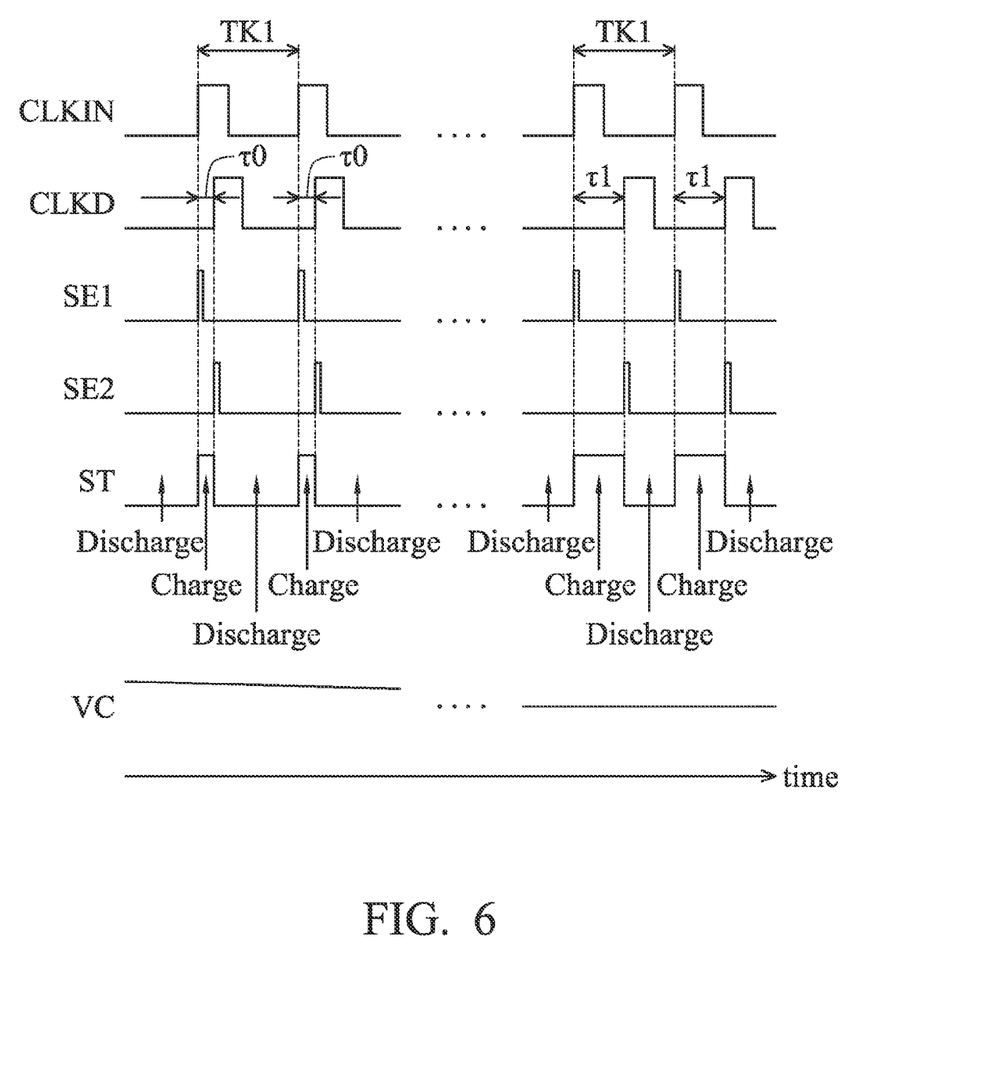
FIG. 6 is a diagram for illustrating signal waveforms of a duty cycle corrector according to an embodiment of the invention.

FIG. 6 is a diagram for illustrating signal waveforms of the duty cycle corrector 100 according to an embodiment of the invention. The embodiment of FIG. 6 describes how the CP control voltage VC gradually becomes constant. The input clock signal CLKIN may have any duty cycle, such as 20% or 30%. The delay clock signal CLKD is generated by delaying the input clock signal CLKIN for an initial delay period $\tau 0$. In the beginning (as shown in the left-half portion of FIG. 6), assuming that the CP circuit 150 operates in the first mode, and in one embodiment the initial delay period $\tau 0$ is set to be as short as possible. The first clock edge signal SE1 includes a sequence of pulses, and each pulse is aligned with a respective rising edge of the input clock signal CLKIN. The second clock edge signal SE2 includes another sequence of pulses, and each pulse is aligned with a respective rising edge of the delay clock signal CLKD. The toggling signal ST is set and reset by the first clock edge signal SE1 and the second clock edge signal SE2, respectively, and the toggling signal ST substantially has a square wave which includes alternate discharging and charging periods (i.e., alternating low and high logic periods) to pull down and up the CP control voltage VC. Since the initial delay period $\tau 0$ is very short, each discharging period is much longer than each charging period, and therefore the CP control voltage VC gradually becomes lower. It is noted that the delay period of the VCD circuit 110 is adjusted from the initial delay period $\tau 0$ according to the CP control voltage VC. In some embodiments, they are negatively related to each other, that is, if the CP control voltage VC becomes higher, the delay period of the VCD circuit 110 may become shorter, and conversely, if the CP control voltage VC becomes lower, the delay period of the VCD circuit 110 may become longer. For such a negative feedback design, after a specific period of time (e.g., the calibration period TC), the delay period of the VCD circuit 110 is fine-tuned, and the CP control voltage VC finally reaches a constant value (as shown in the right-half portion of FIG. 6). In some embodiments, the fine-tuned delay period $\tau 1$ of the VCD circuit 110 is substantially 0.5 clock period TK1 of the input clock signal CLKIN, and it causes the discharging and charging periods of the CP circuit 150 to be equal and further keeps the CP control voltage VC unchanged. After then, the CP circuit 150 may enter the second mode (e.g., a user may have set the mode selection signal SM to a high logic level) to maintain the fine-tuned CP control voltage VC at constant without toggling with the input clock signal CLKIN; in another embodiment, the fine-tuned CP control voltage VC may continue to toggle with the input clock signal CLKIN if the mode selection signal SM is set at a low logic level. The output toggling signal ST may be outputted as the correct output clock signal with a 50% duty cycle generated by the duty cycle corrector 100 by combining the input clock signal CLKIN with the fine-tuned delay clock signal CLKD.

The duty cycle corrector of the invention requires just one input clock to provide a correct output clock signal with a 50% duty cycle. According to a measurement result, the duty cycle corrector of the invention may accept a wider range of input clock duty cycles (e.g., from 20% to 80%) than a conventional design does, and it is less sensitive to PVT (Process, Voltage, and Temperature) variations.

The invention may merely include any one or more features of any one or more embodiments of FIGS. 1-6. In other words, not all of the features shown in the figures should be implemented in the duty cycle corrector of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A duty cycle corrector, comprising:
   a VCD (Voltage-Controlled Delay) circuit, receiving an input clock signal, and delaying the input clock signal for a delay period so as to generate a delay clock signal, wherein the delay period is adjusted according to a CP (Charge Pump) control voltage;
   an edge detector, detecting clock edges of the input clock signal and the delay clock signal so as to correspondingly generate a first clock edge signal and a second clock edge signal;
   an SR latch, generating a toggling signal according to the first clock edge signal and the second clock edge signal;
   a mode controller, generating a mode control voltage; and
   a CP (Charge Pump) circuit, operating in either a first mode or a second mode according to the mode control voltage, and generating the CP control voltage according to the toggling signal and the mode control voltage;
   wherein the toggling signal is generated as an output signal of the duty cycle corrector.

2. The duty cycle corrector as claimed in claim 1, wherein the edge detector comprises:
   a first inverter, wherein the first inverter has an input terminal for receiving the input clock signal, and an output terminal;
   a first AND gate, wherein the first AND gate has a first input terminal for receiving the input clock signal, a second input terminal coupled to the output terminal of the first inverter, and an output terminal for outputting the first clock edge signal;
   a second inverter, wherein the second inverter has an input terminal for receiving the delay clock signal, and an output terminal; and
   a second AND gate, wherein the second AND gate has a first input terminal for receiving the delay clock signal, a second input terminal coupled to the output terminal of the second inverter, and an output terminal for outputting the second clock edge signal.

3. The duty cycle corrector as claimed in claim 1, wherein the SR latch comprises:
   a first NOR gate, wherein the first NOR gate has a first input terminal for receiving the first clock edge signal, a second input terminal for receiving the toggling signal, and an output terminal; and
   a second NOR gate, wherein the second NOR gate has a first input terminal for receiving the second clock edge signal, a second input terminal coupled to the output terminal of the first NOR gate, and an output terminal for outputting the toggling signal.

4. The duty cycle corrector as claimed in claim 1, wherein the mode controller comprises:
   a programmable counter, receiving a start signal, the input clock signal, and a plurality of duration bits, and accordingly generating a notification signal, wherein when the start signal rises from a low logic level to a high logic level, the programmable counter starts to count a calibration period, wherein when the calibration period expires, the notification signal rises from the low logic level to the high logic level, and wherein the calibration period is determined by the duration bits; and
   a third AND gate, wherein the third AND gate has a first input terminal for receiving the notification signal, a second input terminal for receiving a mode selection signal, and an output terminal for outputting the mode control voltage.

5. The duty cycle corrector as claimed in claim 4, wherein when the mode equal to the high logic level and the calibration period has not expired, the mode control voltage is set to the low logic level, and the CP circuit operates in the first mode such that the CP control voltage is adjustable, and wherein when the mode selection signal is equal to the high logic level and the calibration period has expired, the mode control voltage is set to the high logic level, and the CP circuit operates in the second mode such that the CP control voltage is not adjustable.

6. The duty cycle corrector as claimed in claim 5, wherein after the CP control voltage becomes constant, the delay period of the VCD circuit is substantially equal to 0.5 clock period of the input clock signal such that the output clock signal substantially has a 50% duty cycle.

7. The duty cycle corrector as claimed in claim 4, wherein the number of the duration bits is 4.

8. The duty cycle corrector as claimed in claim 4, wherein the programmable counter comprises:
   a fourth AND gate, wherein the fourth AND gate has a first input terminal for receiving the input clock signal, a second input terminal, and an output terminal;
   a plurality of D flip-flops, wherein each D flip-flop has a clock terminal, a data input terminal, an output terminal, an inverted output terminal, and an inverted reset terminal for receiving the start signal, wherein the inverted output terminal of each D flip-flop is fed back to the data input terminal, wherein the clock terminal of each D flip-flop is coupled to the output terminal of a previous D flip-flop, and wherein the clock terminal of a first D flip-flop is coupled to the output terminal of the fourth AND gate.

9. The duty cycle corrector as claimed in claim 8, wherein the programmable counter further comprises:
   a plurality of XNOR gates, each corresponding to one of the plurality of D flip-flops, wherein each XNOR gate has a first input terminal for receiving one of a plurality of duration bits, a second input terminal coupled to the output terminal of the corresponding D flip-flop, and an output terminal, and wherein a calibration period is determined by the plurality of duration bits;
   a fifth AND gate, wherein the fifth AND gate has a plurality of input terminals each corresponding to one of the plurality of XNOR gates and an output terminal, wherein each input terminal is coupled to the output terminal of the corresponding XNOR gate; and
   a fifth D flip-flop, wherein the fifth D flip-flop has a clock terminal for receiving the input clock signal, a data input terminal coupled to the output terminal of the fifth AND gate, an output terminal for outputting the notification signal, an inverted output terminal fed back to the second input terminal of the fourth AND gate, and an inverted reset terminal for receiving the start signal.

10. The duty cycle corrector as claimed in claim 1, wherein the CP circuit comprises:
    a fourth PMOS transistor (P-type Metal Oxide Semiconductor Field Effect Transistors), wherein the fourth PMOS transistor has a gate coupled to the inverse of the toggling signal, a source coupled to a work voltage, and a drain;

a fifth PMOS transistor, wherein the fifth PMOS transistor has a gate for receiving the mode control voltage, a source coupled to the drain of the fourth PMOS transistor, and a drain coupled to a CP output node;

a first NMOS transistor (N-type Metal Oxide Semiconductor Field Effect Transistors), wherein the first NMOS transistor has a gate coupled to the inverse of the mode control voltage, a source, and a drain coupled to the CP output node;

a second NMOS transistor, wherein the second NMOS transistor has a gate coupled to the inverse of the toggling signal, a source coupled to a ground voltage, and a drain coupled to the source of the first NMOS transistor; and an output capacitor, coupled between the CP output node and the ground voltage;

wherein the CP output node is arranged to output the CP control voltage.

\* \* \* \* \*